United States Patent
Shuta (10) Patent No.: US 8,534,786 B2
(45) Date of Patent: Sep. 17, 2013

(54) DISCHARGE ENERGY RECOVERY DEVICE AND IMAGE FORMING APPARATUS USING SAME

(75) Inventor: Tomohiro Shuta, Kanagawa (JP)

(73) Assignee: Ricoh Co., Ltd., Tokyo (JP)

( * ) Notice: Subject to any disclaimer, the term of this patent is extended or adjusted under 35 U.S.C. 154(b) by 44 days.

(21) Appl. No.: 13/295,523

(22) Filed: Nov. 14, 2011

(65) Prior Publication Data

US 2012/0133692 A1    May 31, 2012

(30) Foreign Application Priority Data

Nov. 26, 2010    (JP) .................................. 2010-264239

(51) Int. Cl.
*B41J 29/38*    (2006.01)
(52) U.S. Cl.
USPC .................................................... 347/10
(58) Field of Classification Search
CPC .................... B41J 2/04506; B41J 2/04581
USPC ............................ 347/9–11, 68; 310/316.03
See application file for complete search history.

(56) References Cited

U.S. PATENT DOCUMENTS 6,276,772 B1 *    8/2001    Sakata et al. .................... 347/10
2006/0192804 A1    8/2006    Nakata et al.

FOREIGN PATENT DOCUMENTS

JP    2002103603 A    4/2002
JP    2009292077 A    12/2009

\* cited by examiner

*Primary Examiner* — An Do
(74) *Attorney, Agent, or Firm* — Harness, Dickey & Pierce (57) ABSTRACT

A discharge energy recovery device to recover discharge energy discharged from a piezoelectric element when the piezoelectric element is driven includes a drive voltage generator to generate a voltage to drive the piezoelectric element; a discharge voltage monitoring unit to monitor a discharge voltage discharged from the piezoelectric element when the piezoelectric element is driven by the drive voltage generator; a plurality of charge accumulating devices to accumulate a charge corresponding to a voltage monitored by the discharged voltage discharge voltage monitoring unit; and a selection unit to select one or more charge accumulating devices from the plurality of charge accumulating devices having capacity sufficient to enable accumulation of the charge corresponding to the voltage monitored by the discharge voltage monitoring unit.

9 Claims, 6 Drawing Sheets

|  | NUMBER OF DRIVEN ACTUATORS | | | |
|---|---|---|---|---|
|  | 1-48 | 49-96 | 97-144 | 145-192 |
| Q1 | ON | ON | ON | ON |
| Q2 | OFF | ON | ON | ON |
| Q3 | OFF | OFF | ON | ON |
| Q4 | OFF | OFF | OFF | ON |

DISCHARGE ENERGY RECOVERY DEVICE AND IMAGE FORMING APPARATUS USING SAME

CROSS-REFERENCE TO RELATED APPLICATION

This application claims priority to Japanese Patent Application No. 2010-264239, filed on Nov. 26, 2010 in the Japan Patent Office, which is incorporated by reference herein in its entirety.

BACKGROUND OF THE INVENTION

1. Field of the Invention

The present invention relates to a discharge energy recovery device and an image forming apparatus employing the discharge energy recovery device.

2. Description of the Background Art

Figure 1:
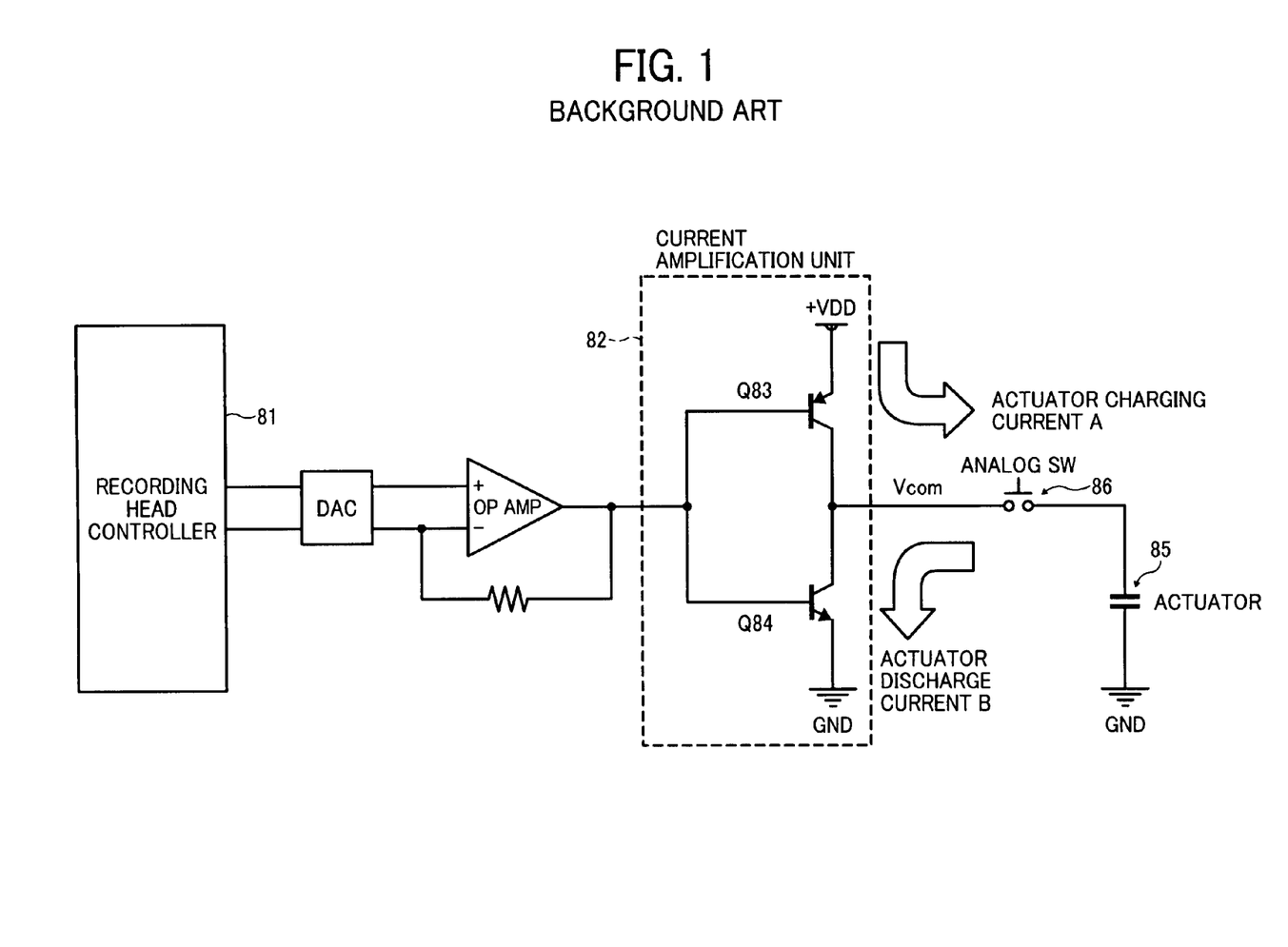
FIG. 1 shows a conventional circuit diagram of piezoelectric element drive circuit.

Some image forming apparatuses print images on recording media by jetting ink droplets, in which a piezoelectric element (hereinafter, also referred to as an actuator) is driven when supplied with a given voltage and a large number of piezoelectric elements are driven to form an image. As shown in FIG. 1, current amplification of actuator drive voltage waveform is typically conducted using a bipolar transistor. FIG. 1 shows a typical circuit diagram of a piezoelectric element drive circuit.

In the configuration shown in FIG. 1, base terminals of bipolar transistors Q83 and Q84 constituting a current amplification unit 82 become low ("L") and an analog switch (SW) 86 is switched ON by a control signal from a recording head controller 81, at which time a voltage +VDD is applied to an actuator 85 actuator charging current A flows to the actuator 85, and a voltage Vcom which is a charged voltage of the actuator 85 flows to ground (GND) as actuator discharge current B.

However, in the conventional current amplification circuit using a bipolar transistor shown in FIG. 1, most of the power to drive the actuator is lost as heat from the bipolar transistor, resulting is wasted power consumption. Although many patent applications disclose configurations to recover the actuator discharge current B of actuator to reuse as the power to drive the actuator (actuator drive power), none of these considers the effect on the actuator drive voltage waveform itself (e.g., irregular waveform, hindering actuator drive control).

JP-2002-103603-A discloses a configuration to reduce power consumption by effectively using electric energy accumulated in one or more actuators, in which actuator discharge current is charged to two charging capacitors, and then the power charged to the charging capacitors is reused as power to drive the actuators.

However, because large-capacity capacitors are used as the charging capacitors the charging time of the capacitors lengthens, thereby slowing the drive cycle of the actuators themselves. Further, a charging current to the actuators and a discharge current from the actuators vary depending on the number and capacitance of the actuators actually driven. Due to such fluctuation, the charge amount to be charged to one or more charging capacitors also fluctuates. As a result, the rising time and falling time of drive voltage pattern or waveform of the actuators fluctuate, hindering control of the drive voltage pattern.

SUMMARY

In one aspect of the present invention, a discharge energy recovery device to recover discharge energy discharged from a piezoelectric element when the piezoelectric element is driven is devised. The discharge energy recovery device includes a drive voltage generator to generate a voltage to drive the piezoelectric element; a discharge voltage monitoring unit to monitor a discharge voltage discharged from the piezoelectric element when the piezoelectric element is driven by the drive voltage generator; a plurality of charge accumulating devices to accumulate a charge corresponding to a voltage monitored by the discharged voltage discharge voltage monitoring unit; and a selection unit to select one or more charge accumulating devices from the plurality of charge accumulating devices having capacity sufficient to enable accumulation of the charge corresponding to the voltage monitored by the discharge voltage monitoring unit.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

The accompanying drawings are intended to depict exemplary embodiments of the present invention and should not be interpreted to limit the scope thereof. The accompanying drawings are not to be considered as drawn to scale unless explicitly noted, and identical or similar reference numerals designate identical or similar components throughout the several views.

DETAILED DESCRIPTION OF EXEMPLARY EMBODIMENTS

A description is now given of exemplary embodiments of the present invention. It should be noted that although such terms as first, second, etc. may be used herein to describe various elements, components, regions, layers and/or sections, it should be understood that such elements, components, regions, layers and/or sections are not limited thereby because such terms are relative, that is, used only to distinguish one element, component, region, layer or section from another region, layer or section. Thus, for example, a first element, component, region, layer or section discussed below could be termed a second element, component, region, layer or section without departing from the teachings of the present invention. In addition, it should be noted that the terminology used herein is for the purpose of describing particular embodiments only and is not intended to be limiting of the present invention. Thus, for example, as used herein, the singular forms "a", "an" and "the" are intended to include the plural forms as well, unless the context clearly indicates otherwise. Moreover, the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Furthermore, although in describing views shown in the drawings, specific terminology is employed for the sake of clarity, the present disclosure is not limited to the specific terminology so selected and it is to be understood that each specific element includes all technical equivalents that operate in a similar manner and achieve a similar result.

Referring now to the drawings, an apparatus or system according to an example embodiment is described hereinafter. In the present invention, discharge energy discharged by a piezoelectric element when the piezoelectric element is driven can be recovered by a discharge energy recovery device. Specifically, when recovering actuator discharge current, recovering performance can be changed depending on the number and capacitance of actuators to be driven.

Figure 2:
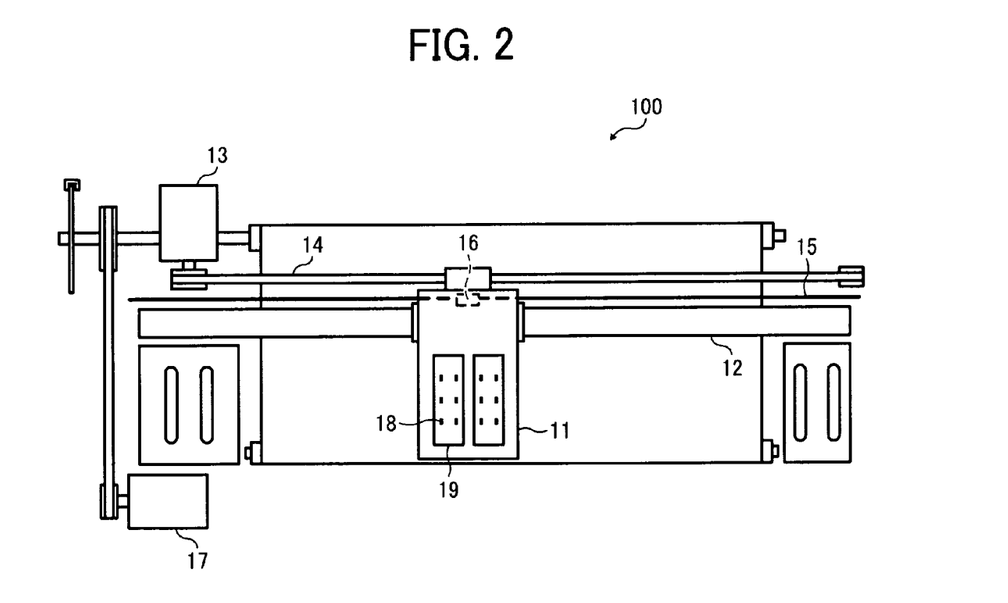
FIG. 2 shows a schematic configuration of an image forming apparatus according to an example embodiment.

FIG. 2 shows a basic configuration of an image forming apparatus 100 according to an example embodiment. In FIG. 2, a carriage 11 supported by a guide rod 12 can be scanned in a main scanning direction (left-to-right direction in FIG. 2) by a main scan motor 13 and a pulley 14. The carriage 11 includes a recording head 19 having ink nozzles 18 arranged in given directions to jet ink droplets of yellow (Y), cyan (C), magenta (M), and black (K).

By jetting ink droplets at given positions while moving the carriage 11 in the main scanning direction, an image can be formed on a recording medium. Positional information of the carriage 11 can be obtained using an encoder sheet 15 and an encoder sensor 16. The encoder sheet 15, fixed to a casing, having markings disposed with a same interval, and such markings are read by an encoder sensor 16 fixed on the carriage 11 while moving the carriage 11, and then the counted number of markings is added or deleted, by which the positional information of the carriage 11 can be obtained.

By conducting such carriage movement and ink jetting operation in the main scanning direction for one time, an image can be formed for one line with a width corresponding to a length of nozzle length in the sub-scanning direction. Upon forming one line image, a sub-scan motor is driven to move the recording medium in the sub-scanning direction (up-to-bottom direction in FIG. 2), and then another one line image is formed similarly. By repeating such movement and ink jetting operation, an image can be formed on the recording medium.

Figure 3:
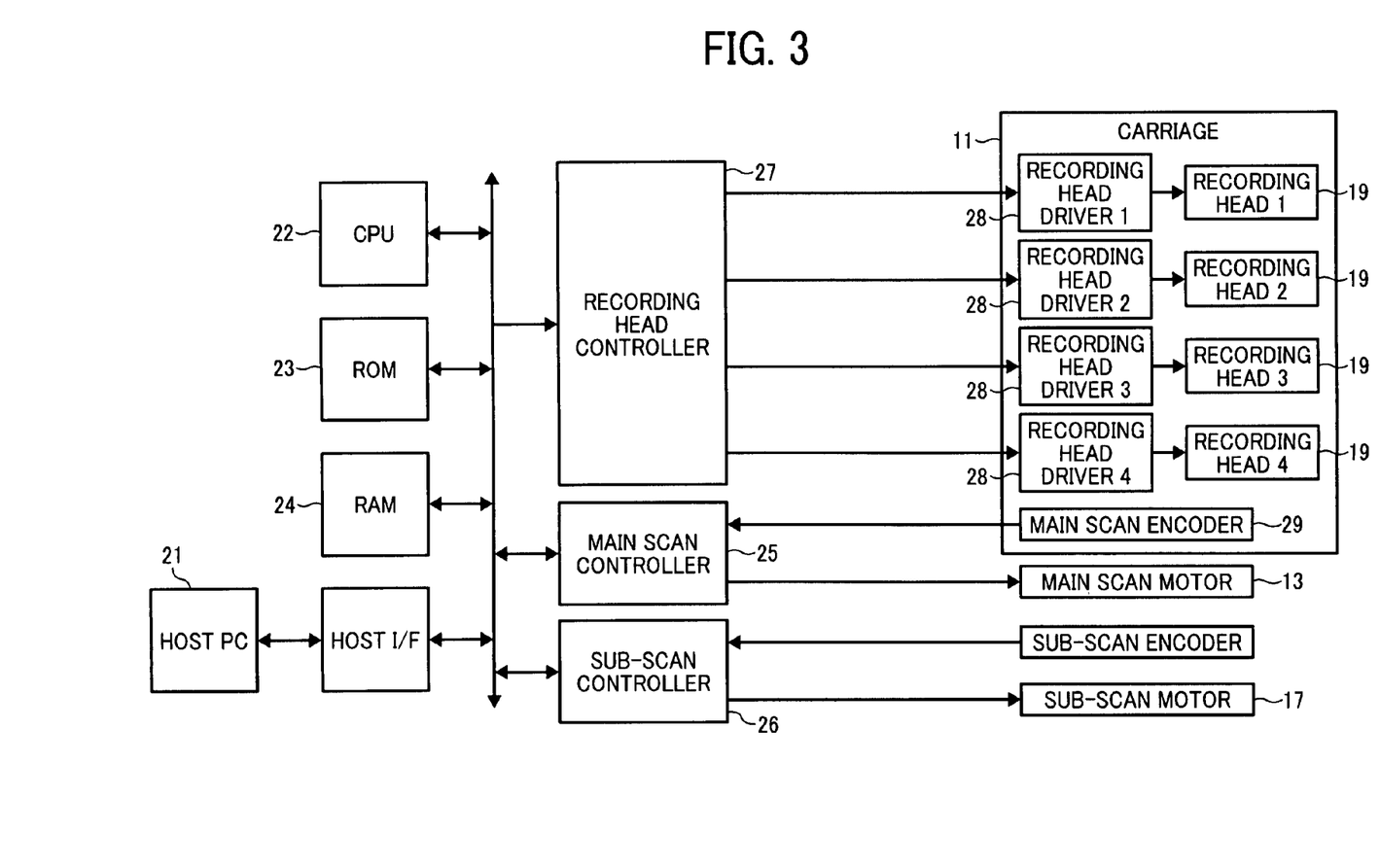
FIG. 3 shows a functional block diagram of an image forming apparatus according to an example embodiment.

A description is given of a functional block diagram of the image forming apparatus 100 according to an example embodiment with reference to FIG. 3. FIG. 3 shows a functional block diagram of the image forming apparatus 100. In such image forming apparatus 100, a firmware to conduct a hardware control and drive pattern data of the recording head 19 can be stored in a read only memory (ROM) 23. Upon receiving print jobs such as image data from a host personal computer (PC) 21, a central processing unit (CPU) 22 stores the image data in a random access memory (RAM) 24, and moves the carriage 11 having the recording head 19 at a given position on a recording medium using a main scan controller 25.

While in view of positional information of the carriage 11 obtainable from a main scan encoder 29, a recording head controller 27 transfers the image data stored in the RAM 24, the drive pattern data of the recording head 19 stored in the ROM 23, and control signals to a recording head drive unit 28.

The recording head drive unit 28 drives the recording head 19 based on data transferred from the recording head controller 27 to jet ink droplets. The recording head controller 27 can function as a discharge voltage monitoring unit to monitor a discharge voltage discharged from the piezoelectric element when the piezoelectric element is driven by the drive voltage generator. The recording head controller 27 can be used as a control unit to control the process related to the present invention. The recording head controller 27 and other controllers can be configured using various types of processors, circuits, or the like such as a programmed processor, a circuit, an application specific integrated circuit (ASIC), used singly or in combination, and can be implemented in hardware or as a hardware/software combination.

Figure 4:
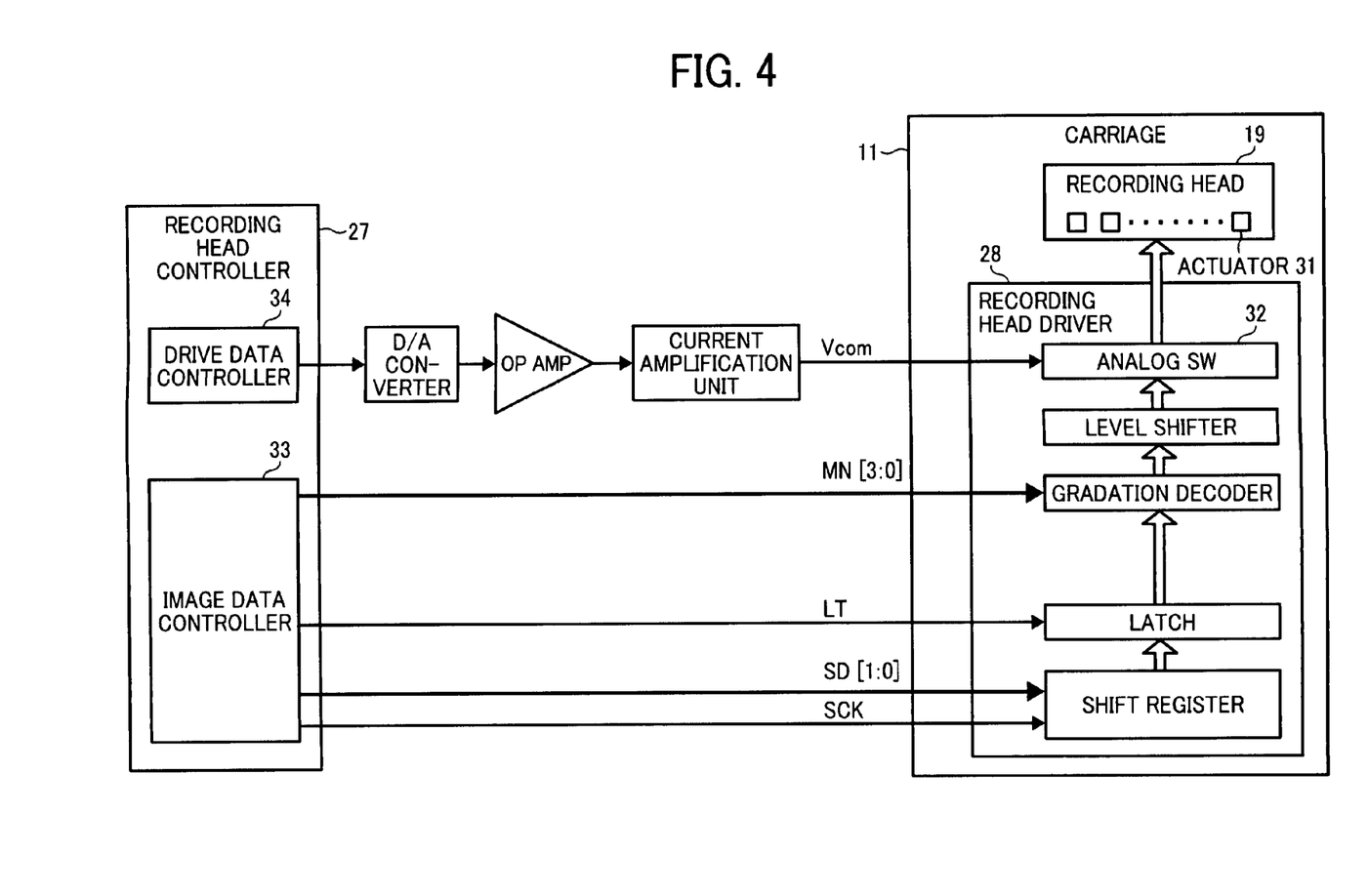
FIG. 4 shows a block diagram of a recording head control system of an image forming apparatus according to an example embodiment.

A description is given of the recording head controller 27 of the image forming apparatus 100 with reference to FIG. 4. FIG. 4 shows a block diagram of a recording head control of the image forming apparatus 100, in which one or more actuators 31 disposed in the recording head 19 are deformed to jet ink droplets.

An application of charge voltage Vcom to the actuator 31 is controlled by an ON/OFF control of an analog switch 32 to deform the actuator 31. The ON/OFF control of analog switch 32 is conducted based on information from the image data controller 33. The charge voltage Vcom for the actuator 31 is generated by conducting a current amplification based on information of a drive data controller 34 in the recording head controller 27. The drive data controller 34 controls drive pattern or waveform of actuator 31. In a configuration shown in FIG. 4, at least the drive data controller 34 in the recording head controller 27, a digital/analog converter, and an operational amplifier (OP AMP) can function as a drive voltage generator to generate a voltage to drive the actuator 31 such as a piezoelectric element or the like.

Figure 5:
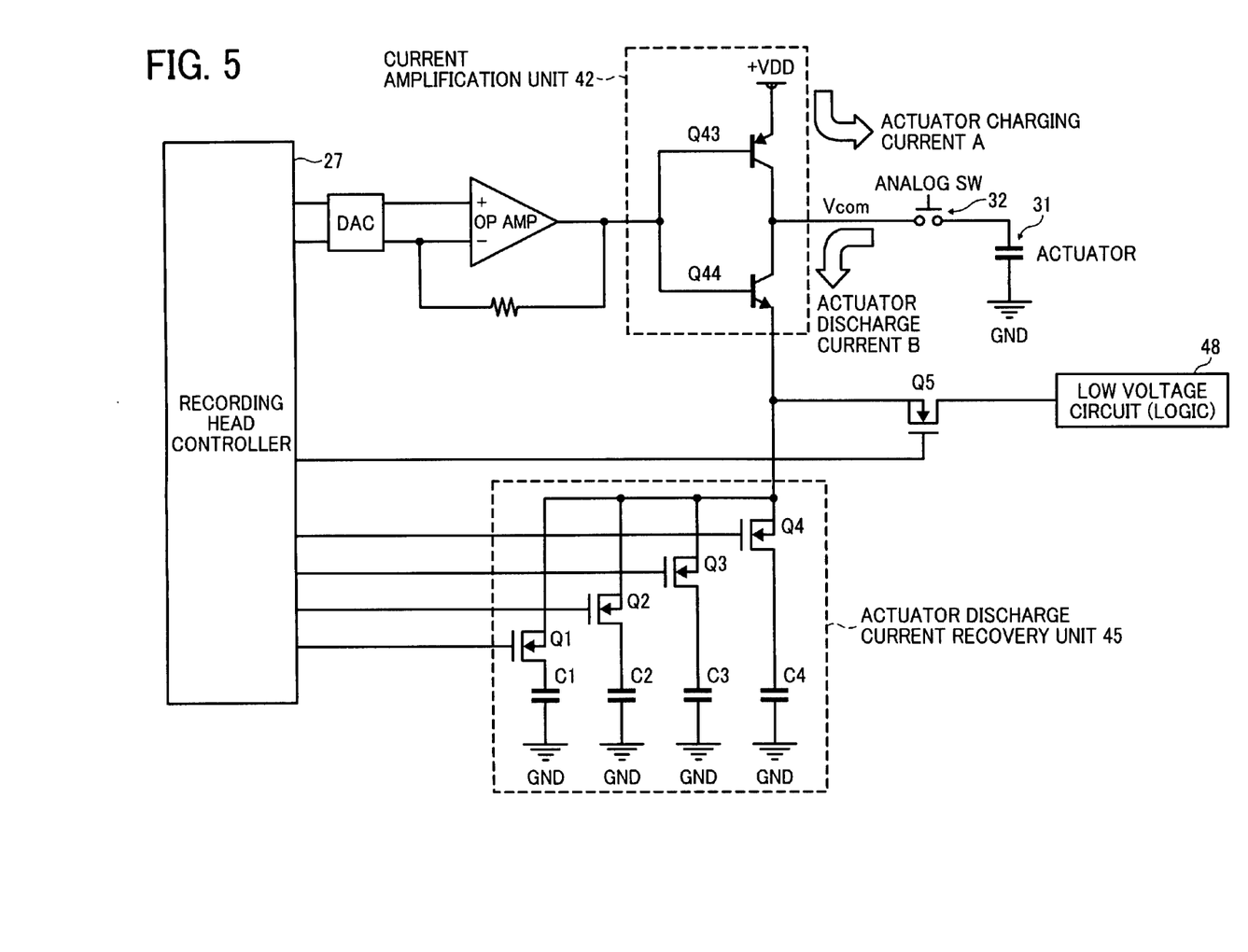
FIG. 5 shows a circuit diagram of a discharge energy recovery device according to an example embodiment.

A description is given of a configuration of a discharge energy recovery device according to an example embodiment with reference to FIG. 5. FIG. 5 shows a circuit diagram of the discharge energy recovery device according to an example embodiment. In a configuration of FIG. 5, when the analog switch (SW) 32 is set to the ON status, and a bipolar transistor Q44 is set to the ON status, charges accumulated in the actuator 31 can flow as actuator discharge current B.

As shown in FIG. 5, an actuator discharge current recovery unit 45 of the discharge energy recovery device includes a plurality of combinations of capacitors and field effect transistors (FET). Specifically, a capacitor C1 and an FET Q1 are connected in a serial manner, a capacitor C2 and an FET Q2 are connected in a serial manner, a capacitor C3 and an FET Q3 are connected in a serial manner, and a capacitor C4 and an FET Q4 are connected in a serial manner. By setting the ON status for the FETs Q1, Q2, Q3, and Q4, the actuator discharge current B flows to the capacitors C1, C2, C3, and C4 respectively connected to the FETs Q1, Q2, Q3, and Q4 in a serial manner, by which charges discharged from the actuator 31 can be accumulated in each of the capacitors C1, C2, C3, and C4. As such, the capacitors C1, C2, C3, and C4 can be used as charge accumulating devices, and further, the number of combinations of capacitors and FETs is not limited any specific numbers.

The recording head controller 27 determines which capacitor (i.e., capacitors C1, C2, C3, and C4) is used to accumulate charges based on an amount of charges to be discharged from the actuator 31. Based on such determination result, the recording head controller 27 selects one or more FETs from the FETs Q1, Q2, Q3, and Q4, and transmits a control signal to the selected FET to set the selected one or more FETs at the ON status. The recording head controller 27 can function as a selection unit to select one or more charge accumulating devices from the plurality of charge accumulating devices having capacity sufficient to enable accumulation of the charge corresponding to the voltage monitored by the discharge voltage monitoring unit. As such, the recording head controller 27 can function as the discharge voltage monitoring unit and the selection unit.

By transmitting a control signal as such, one or more FETs to be set to the ON status can be selected, and then corresponding one or more capacitors to be charged can be selected. It should be noted that the total of charge voltage for the selected to-be-charged capacitor, corresponding to the amount of charges accumulated in the capacitor, needs to be a voltage level equal to or less than a drive voltage of the actuator 31. With such a configuration, the voltage pattern or waveform to drive the actuator 31 does not become smaller than a charging voltage of the capacitor, and thereby the effect of charging of capacitor to the drive voltage pattern or waveform of the actuator can be reduced.

Figure 6:
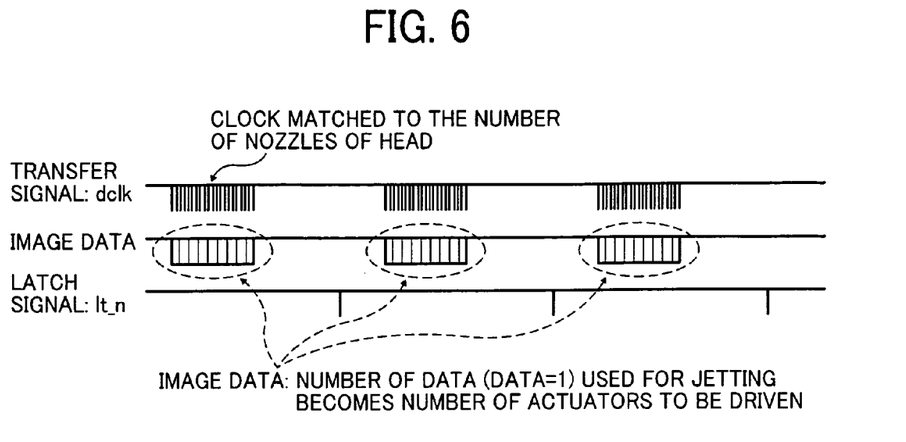
FIG. 6 shows a schematic view of the number of driven actuators.

A description is given of a method of selecting one or more capacitors to be charged using charges discharged from the actuator 31 with reference to FIGS. 5 and 6. FIG. 6 shows a schematic view of the number of driven actuators. Although the number of the actuator 31 shown in FIG. 5 is one, the number of actuators 31 is not limited one but a plurality of actuators can be used as required, and the number of actuators 31 may be also referred to as channels. For the simplicity of expression, the one or more actuators 31 may be simply referred to as the actuator 31.

When the recording head controller 27 transmits a transfer signal "dclk" to the actuator 31, the recording head controller 27 transmits image data to the actuator 31 which is required to be driven. Then, the actuator 31 obtains the transmitted image data when a latch signal "lt_n" is transmitted from the recording head controller 27.

The number of data used for jetting ink, included in the image data transmitted from the recording head controller 27 to the actuator 31, matches to the number of actuators which are actually driven. Specifically, the recording head controller 27 computes how many actuators or channels are instructed to be driven by the transmitted image data. Based on a computation result of the number of actuators or channels, the number of capacitors in the actuator discharge current recovery unit 45, which need to be charged, can be determined.

When the number of actuators or channels to be driven becomes large, the number of capacitors to be charged is increased, by which a total of charge amount used for the charging becomes large. In contrast, when the number of actuators or channels to be driven is small, the number of capacitors to be charged is decreased, by which a total of charge amount used for charging becomes small. Because the load can be decreased due to such small number of the capacitors, the effect of charging process to the drive voltage pattern or waveform of actuator can be reduced.

Figure 7:
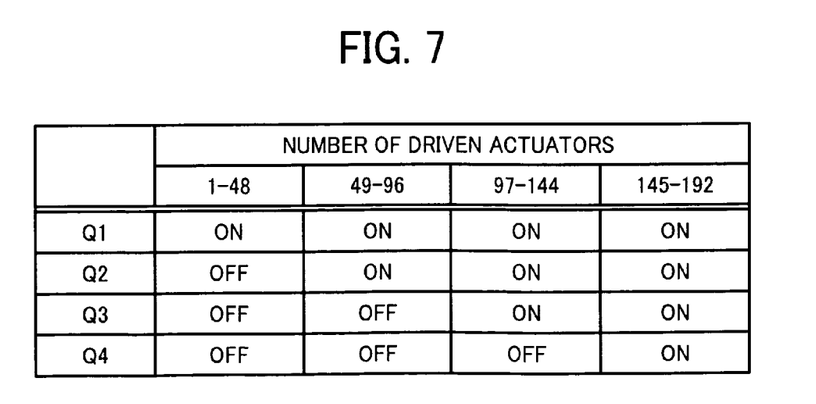
FIG. 7 shows a relationship between the number of driven actuators and the number of capacitors of the discharge energy recovery device according to an example embodiment.

A description is given of a relationship between the number of channels or actuators to be driven and the number of capacitors to be charged by the discharge current from the actuators with reference to FIG. 7. FIG. 7 shows an example relationship between the number of actuators to be driven and the number of capacitors of the actuator discharge energy recovery unit 45.

In a case of FIG. 7, the maximum number of channels or actuators that can be driven by one drive voltage pattern or waveform is set to, for example, 192 channels. FIG. 7 shows an example case that the capacitors used for charging includes four capacitors C1, C2, C3, C4, and shows which FET is set to the ON status among the FETs Q1, Q2, Q3, Q4 to secure the number of to-be-charged capacitors corresponding to the number of to-be-actually-driven actuators, wherein the actually-driven actuators are selected from 192 channels.

If the capacitance of each of the capacitors C1, C2, C3, and C4 is set to the same value, and the number of channels or actuators to be driven is increased simply, the number of FETs used for the ON/OFF control is also increased following the increase of channels or actuators to be driven, and thereby the number of capacitors to be charged is resultantly increased, by which the charge amount to be charged to the capacitors also increases.

In an example case of FIG. 7, the capacitance of the capacitors C1, C2, C3, and C4 are assumed to set with the same value. However, the capacitance of the capacitors C1, C2, C3, and C4 is not limited such case. For example, the capacitance of the capacitors C1, C2, C3, and C4 can be set different values for each of the capacitors C1, C2, C3, and C4 (i.e., a plurality of capacitances are set), in which a combination of to-be-charged capacitors varies depending on a combination of FETs, which are controlled by the ON/OFF control, by which the amount of charges to be charged in the capacitors can be varied for various amount. By setting a combination of charge capacitors matching to-be-discharged charge amount, the effect of charging process to the drive voltage pattern or waveform of the actuator can be reduced.

As above described, by changing the number of to-be-charged capacitors depending on the number and/or capacitance of actuators to be driven, the actuator discharge current can be recovered without affecting the control of drive voltage pattern or waveform of the actuators.

Further, because the recovery of the actuator discharge current can be conducted at a voltage level equal to or less than the drive voltage of the actuators, the actuator discharge current can be recovered without affecting the control of drive voltage pattern or waveform of the actuators, by which a problem that the drive voltage or waveform of actuators becomes smaller than the charge potential of to-be-charged capacitors can be prevented.

As for the above described example embodiments, without affecting to the actuator drive voltage pattern, a discharge energy recovery device can efficiently recover some of power used for driving actuators, and can reuse as effective power, and an image forming apparatus employing such discharge energy recovery device can be devised. As for the above described example embodiments, without affecting to the actuator drive voltage pattern, the actuator discharge current can be recovered efficiently and reused as effective power, and the wasteful usage of power can be reduced. The above-described discharge energy recovery devices can be applied to various electronic apparatuses including image forming apparatuses.

Numerous additional modifications and variations are possible in light of the above teachings. It is therefore to be understood that within the scope of the appended claims, the disclosure of the present invention may be practiced otherwise than as specifically described herein. For example, elements and/or features of different examples and illustrative embodiments may be combined each other and/or substituted for each other within the scope of this disclosure and appended claims.

What is claimed is:

1. A discharge energy recovery device configured to recover discharge energy discharged from a piezoelectric element when the piezoelectric element is driven, comprising:
 a drive voltage generator configured to generate a voltage to drive the piezoelectric element;

a discharge voltage monitoring unit configured to monitor a discharge voltage discharged from the piezoelectric element when the piezoelectric element is driven by the drive voltage generator;

a plurality of charge accumulating devices configured to accumulate a charge corresponding to a the discharge voltage monitored by the discharged voltage discharge voltage monitoring unit; and a selection unit configured to select a number of the charge accumulating devices from the plurality of charge accumulating devices such that the selected number of charge accumulating devices have a capacity sufficient to store the charge corresponding to the discharge voltage monitored by the discharge voltage monitoring unit.

2. The discharge energy recovery device of claim 1, wherein the charge corresponding to the discharge voltage monitored by the discharge voltage monitoring unit varies depending on the number of piezoelectric elements to be driven and capacitance of each of the piezoelectric elements.

3. The discharge energy recovery device of claim 1, wherein a total voltage corresponding to the charge accumulated at the selected charge accumulator is equal to or less than a voltage that drives the piezoelectric element.

4. An image forming apparatus comprising:
an image forming unit to form an image on a recording medium; and
the discharge energy recovery device of claim 1.

5. The discharge energy recovery device of claim 1, wherein the plurality of charge accumulating devices are capacitors configured to store the charge corresponding to the discharge voltage.

6. The discharge energy recovery device of claim 1, further comprising:
a current recovery unit including a plurality of switches configured to selectively enable the charge accumulating devices selected by the selection unit.

7. The discharge energy recovery device of claim 1, wherein the discharge energy recovery device is configured to recover discharge energy discharged from a plurality of the piezoelectric elements and the selection unit is configured to select the number of charge accumulating devices based on a number of the piezoelectric elements driven by the drive voltage generator.

8. The discharge energy recovery device of claim 7, wherein the selection unit is configured to select the number of charge accumulating devices by accessing a database that associates the number of the driven piezoelectric elements and the number of charge accumulating devices required to store the charge corresponding to the discharge voltage generated by the driven piezoelectric elements.

9. The discharge energy recovery device of claim 1, wherein the discharge energy recovery device is configured to,
accumulate the charge in the plurality of charge accumulating devices at a first time, and
discharge the charge stored in the plurality of charge accumulating devices to the piezoelectric element at a second time, the second time being a later time then the first time.

* * * * *